(12) United States Patent
Song et al.

(10) Patent No.: US 11,480,837 B2
(45) Date of Patent: Oct. 25, 2022

(54) ARRAY SUBSTRATE, DISPLAY PANEL AND DISPLAY DEVICE

(71) Applicants: HEFEI XINSHENG OPTOELECTRONICS TECHNOLOGY CO., LTD., Anhui (CN); BEIJING BOE TECHNOLOGY DEVELOPMENT CO., LTD., Beijing (CN)

(72) Inventors: Xingxing Song, Beijing (CN); Kun Yu, Beijing (CN); Zhongzhen Li, Beijing (CN); Dayong Yu, Beijing (CN); Biao Luo, Beijing (CN); Wenjie Wang, Beijing (CN)

(73) Assignees: HEFEI XINSHENG OPTOELECTRONICS TECHNOLOGY CO., LTD., Hefei (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 464 days.

(21) Appl. No.: 16/332,645

(22) PCT Filed: Jul. 23, 2018

(86) PCT No.: PCT/CN2018/096655
§ 371 (c)(1),
(2) Date: Mar. 12, 2019

(87) PCT Pub. No.: WO2019/062297
PCT Pub. Date: Apr. 4, 2019

(65) Prior Publication Data
US 2021/0278732 A1 Sep. 9, 2021
US 2022/0121071 A9 Apr. 21, 2022

(30) Foreign Application Priority Data

Sep. 30, 2017 (CN) .......................... 201721277826.8

(51) Int. Cl.
*G02F 1/1362* (2006.01)
*G02F 1/1333* (2006.01)
(Continued)

(52) U.S. Cl.
CPC .. *G02F 1/136286* (2013.01); *G02F 1/133345* (2013.01); *G02F 1/134309* (2013.01); *G02F 1/136209* (2013.01); *H01L 27/1244* (2013.01)

(58) Field of Classification Search
CPC ......... G02F 1/136209; G02F 1/134309; G02F 1/136286; G02F 1/133345; G02F 1/136218; H01L 27/1244
See application file for complete search history.

(56) References Cited

U.S. PATENT DOCUMENTS

| 2004/0125301 A1* | 7/2004 | Lee ................... G02F 1/134363 349/141 |
| 2007/0070285 A1 | 3/2007 | Liu et al. |

(Continued)

FOREIGN PATENT DOCUMENTS

| CN | 102023401 A | 4/2011 |
| CN | 102650770 A | 8/2012 |

(Continued)

OTHER PUBLICATIONS

PCT International Search Report, Application No. PCT/CN2018/096655, dated Oct. 24, 2018, 8 pages: with English translation.
(Continued)

*Primary Examiner* — Mariam Qureshi
(74) *Attorney, Agent, or Firm* — Armstrong Teasdale LLP

(57) ABSTRACT

An embodiment of the present disclosure provides an array substrate, a display panel, and a display device, including a substrate, a data line located above the substrate, and a shielding member located on a side, away from the substrate, of the data line, the shielding member includes a conductive screening portion, an orthographic projection of the conductive screening portion on the substrate partially covering an orthographic projection of the data line on the substrate, or the shielding member includes a filling body, an orthographic projection of the filling body on the substrate covering an orthographic projection of the data line on the substrate, and the filling body protruding outward from a surface of the substrate in a direction away from the substrate.

11 Claims, 4 Drawing Sheets

(51) Int. Cl.
*G02F 1/1343* (2006.01)
*H01L 27/12* (2006.01)

(56) References Cited

U.S. PATENT DOCUMENTS

| | | | | |
|---|---|---|---|---|
| 2014/0293199 | A1* | 10/2014 | Sakae | G02F 1/134363 |
| | | | | 438/30 |
| 2016/0202582 | A1* | 7/2016 | Paek | G02F 1/136209 |
| | | | | 349/43 |
| 2016/0313614 | A1* | 10/2016 | Woo | G02F 1/134309 |
| 2018/0292692 | A1* | 10/2018 | Du | G02F 1/1345 |

FOREIGN PATENT DOCUMENTS

| | | |
|---|---|---|
| CN | 203054412 U | 7/2013 |
| CN | 103323981 A | 9/2013 |
| CN | 103676375 A | 3/2014 |
| CN | 207164424 U | 3/2018 |

OTHER PUBLICATIONS

PCT Written Opinion, Application No. PCT/CN2018/096655, dated Oct. 24, 2018, 8 pages.: with English translation of relevant part.

* cited by examiner

ARRAY SUBSTRATE, DISPLAY PANEL AND DISPLAY DEVICE

CROSS REFERENCE TO RELATED APPLICATIONS

This patent application is a National Stage Entry of PCT/CN2018/096655 filed on Jul. 23, 2018, which claims the benefit and priority of Chinese Patent Application No. 201721277826.8 filed on Sep. 30, 2017, the disclosures of which are incorporated by reference herein in their entirety as part of the present application.

BACKGROUND

The present disclosure relates to the field of display techniques, and in particular, to an array substrate, a display panel, and a display device.

At present, in liquid crystal display, there are various ways for the arrangement of common electrodes in a panel, one of which is to arrange the common electrode in a color filter substrate, and the other of which is to arrange both the common electrode and a pixel electrode on an array substrate. For example, a top electrode of High Advanced Dimension Switch (HADS) product is used as a common electrode.

BRIEF DESCRIPTION

Embodiments of the present disclosure provide an array substrate, a display panel, and a display device.

An embodiment of the present disclosure provides an array substrate including a substrate, a data line located above the substrate, and a shielding member located on a side, away from the substrate, of the data line, the shielding member includes a conductive screening portion, an orthographic projection of the conductive screening portion on the substrate partially covering an orthographic projection of the data line on the substrate, or the shielding member includes a filling body, an orthographic projection of the filling body on the substrate covering an orthographic projection of the data line on the substrate, and the filling body protruding outward from a surface of the substrate in a direction away from the substrate.

According to an embodiment of the present disclosure, the conductive screening portion includes a plurality of first conductive strips spaced apart along an extending direction of the data line.

According to an embodiment of the present disclosure, each of the first conductive strips is perpendicular to the data line.

According to an embodiment of the present disclosure, the plurality of first conductive strips cross each other to form a grid-like structure.

According to an embodiment of the present disclosure, the shielding member includes a conductive screening portion, and the shielding member further includes a filling portion, an orthographic projection of the filling portion on the substrate covering an orthographic projection of the data line on the substrate not covered by an orthographic projection of the conductive screening portion, and the filling portion protruding outward from a surface of the substrate in a direction away from the substrate.

According to an embodiment of the present disclosure, the shielding member includes a conductive screening portion, and the array substrate further includes a plurality of pixel units each including a common electrode, the common electrode being arranged in the same layer as the conductive screening portion, and the common electrodes of two adjacent pixel units being integrally formed with the conductive screening portion between the common electrodes of the two adjacent pixel units.

According to an embodiment of the present disclosure, each of the pixel units further includes a pixel electrode, the pixel electrode and the common electrode being arranged in different layers with an insulating layer arranged therebetween.

According to an embodiment of the present disclosure, the shielding member includes a filling body, the array substrate further includes a plurality of pixel units including a common electrode and a pixel electrode arranged in different layers with an insulating layer being arranged therebetween.

According to an embodiment of the present disclosure, a material used for the filling body includes silicon nitride or an organic material.

According to an embodiment of the present disclosure, a section of the filling body is rectangular or isosceles trapezoidal.

As another technical solution, an embodiment of the present disclosure further provides a display panel including any one of the array substrates described above.

As another technical solution, an embodiment of the present disclosure further provides a display device including the display panel as described above.

DETAILED DESCRIPTION

In order to enable those skilled in the art to better understand the technical solutions of the embodiments of the present disclosure, the array substrate, the display panel, and the display device provided by the embodiments of the present disclosure are described in detail below with reference to the accompanying drawings. It should be noted that the embodiments of the present disclosure and the features in the embodiments may be arbitrarily combined with each other without conflict.

Unless otherwise explicitly stated in the context, the singular form of a word used in present disclosure and the appended claims includes the plural thereof and vice versa. Thus, when a singular is mentioned, the plural of the corresponding term is usually included. Similarly, the terms "include", "comprise", "contain" and "have" and their grammatical variants are intended to be inclusive and indicate that elements other than those listed may be present. Where the term "example" is used in present disclosure, especially when it comes after a set of terms, the said "example" is merely illustrative and explanatory and should not be considered to be exclusive or extensive.

In the existing array substrate, the data line is usually Data Com Short (DCS) with the metal layer located thereabove, thereby reducing product yield.

Figure 1:
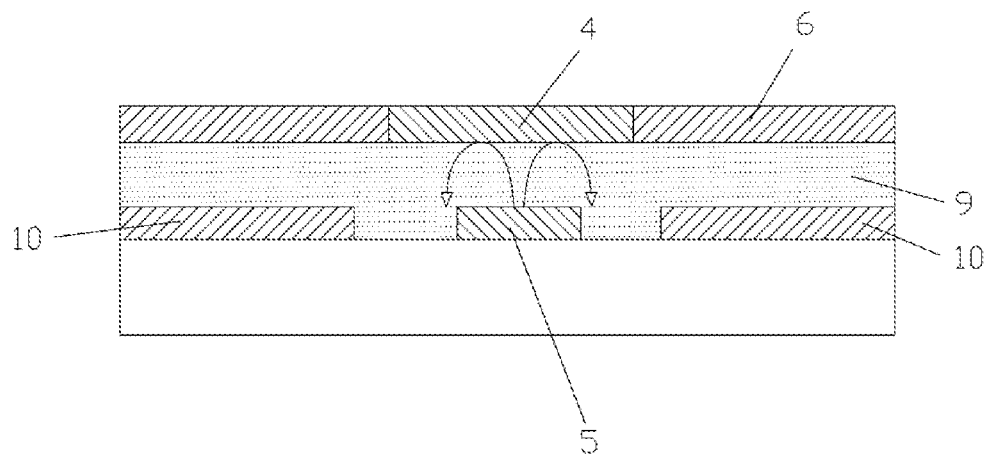
FIG. 1 is a partial cross-sectional view of an array substrate.

FIG. 1 is a partial cross-sectional view of an array substrate. Referring to FIG. 1, the array substrate includes a data line 5, a common electrode 6 located above the data line 5, and a shielding member 4 arranged in the same layer as the common electrode 6, wherein the shielding member 4 completely covers the data line 5 for shielding the data line 5, so as to prevent the electric field generated by the data line 5 from causing some interference to liquid crystal molecules, causing the liquid crystal to be abnormally deflected and leak light.

Since foreign material may be present in an insulating layer 9 between the shielding member 4 and the data line 5, thus the data line 5 and the shielding member 4 are easily electrically connected, so that the two are prone to Data Com Short (DCS), which in turn reduces product yield. Moreover, since the shielding member 4 completely covers the data line 5, the risk area is large, and the probability of DCS phenomenon is high. The so-called risk refers to the risk of Data Com Short between the data line 5 and the shielding member 4.

Figure 2:
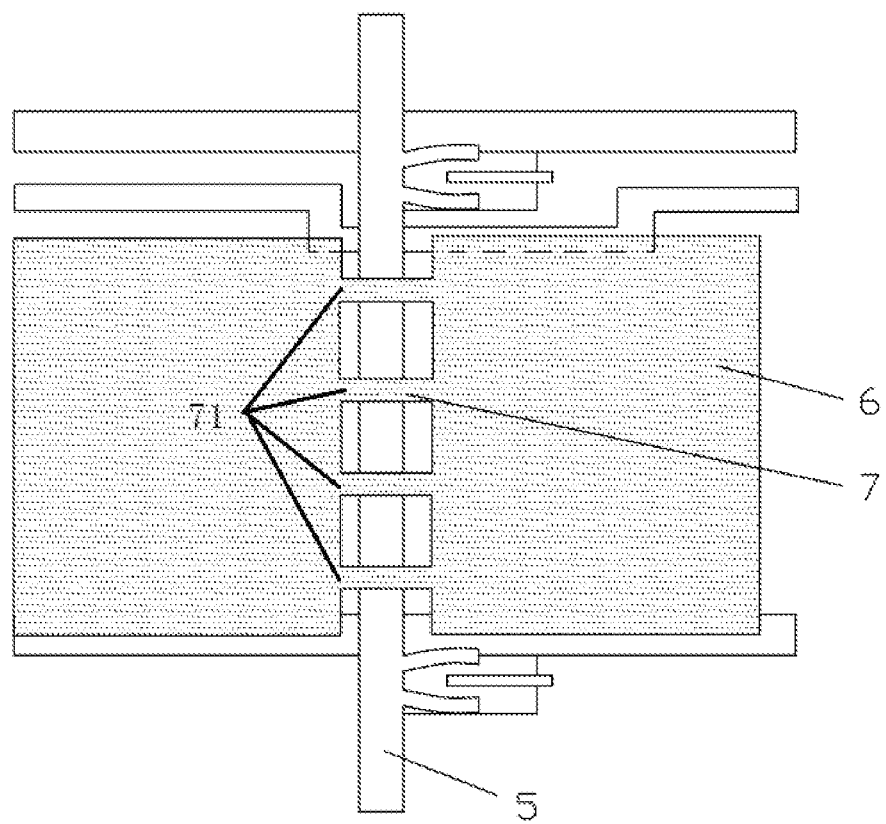
FIG. 2 is a partial plan view of an array substrate according to an embodiment of the present disclosure.

In order to solve the above technical problem, an embodiment of the present disclosure provides an array substrate. FIG. 2 is a partial plan view of the array substrate according to the embodiment of the present disclosure. Referring to FIG. 2, the array substrate includes a substrate 1, a data line 5 located above the substrate 1, and a shielding member located on a side, away from the substrate 1, of the data line 5, the shielding member includes a conductive screening portion 7, and an orthographic projection of the conductive screening portion 7 on the substrate 1 that partially covers an orthographic projection of the data line 5 on the substrate 1, which can reduce the risk area (i.e., the intersection area of a vertical projection that the conductive screening portion 7 and the data line 5 on the array substrate), thereby reducing the occurrence of Data Com Short, further improving product yield.

Specifically, the conductive screening portion 7 may include a plurality of first conductive strips 71, and the plurality of first conductive strips 71 spaced apart along the extending direction of the data line 5. According to an embodiment of the present disclosure, each of the first conductive strips 71 may be perpendicular to the data line 5 to facilitate processing.

According to an embodiment of the present disclosure, the plurality of first conductive strips may also cross each other to form a grid-like structure. This may also reduce the risk area and the grid-like structure has a better shielding effect.

In this embodiment, the array substrate further includes a plurality of pixel units, each of the pixel units includes a common electrode 6 in a plate shape, the common electrode 6 is arranged in the same layer as the conductive screening portion 7, and the common electrodes 6 of two adjacent pixel units are integrally formed with the conductive screening portion 7 located therebetween. Thus, the conductive screening portion 7 can be fabricated simultaneously with the common electrodes 6, so that processing steps are not increased.

It should be noted that, in this embodiment, the common electrode 6 has a plate shape, but the embodiment of the present disclosure is not limited thereto. In practical applications, the common electrode 6 may also adopt any other structure such as a comb shape.

Figure 3A:
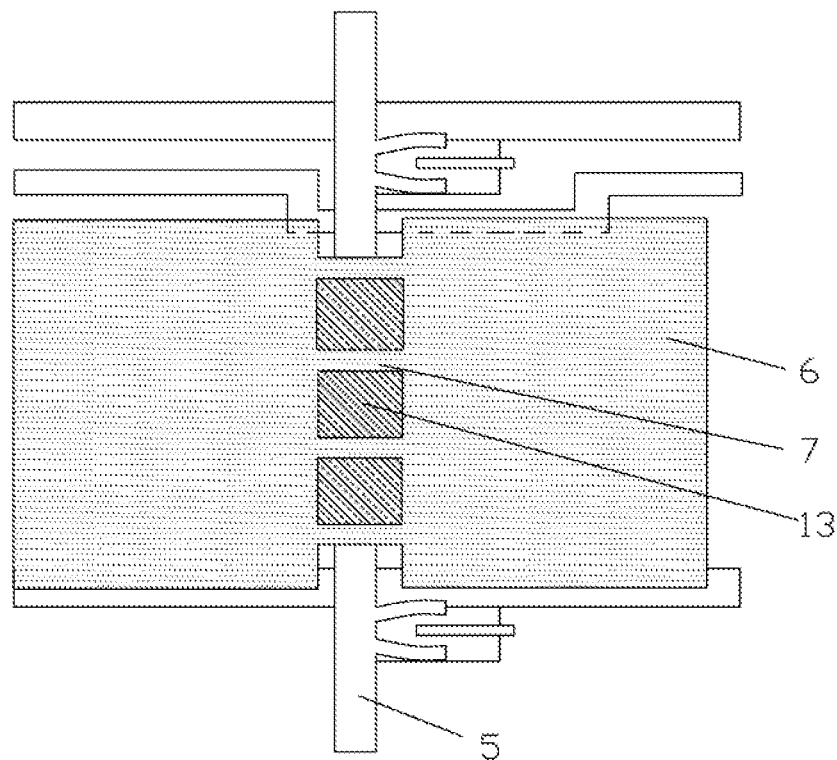
FIG. 3A is a partial plan view of an array substrate according to another embodiment of the present disclosure.
Figure 3B:
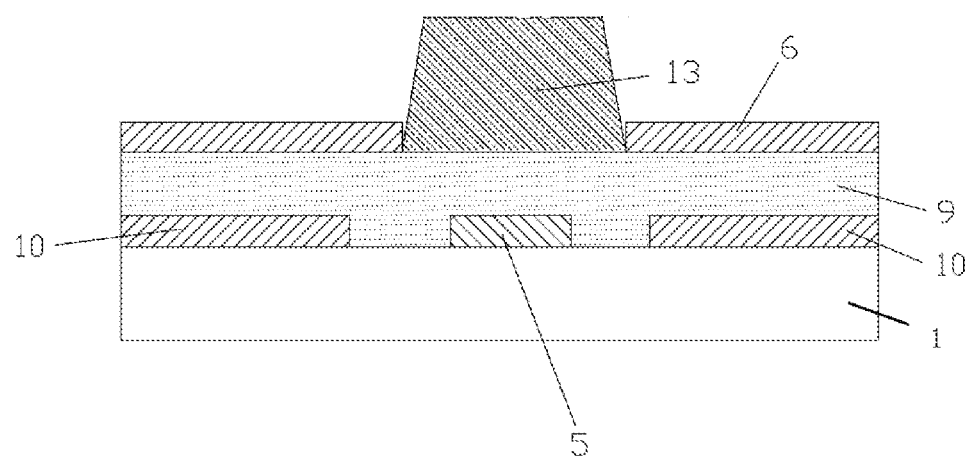
FIG. 3B is a partial cross-sectional view of the array substrate of FIG. 3A according to another embodiment of the present disclosure.

FIG. 3A is a partial plan view of an array substrate according to another embodiment of the present disclosure, and FIG. 3B is a partial cross-sectional view of the array substrate of FIG. 3A according to another embodiment of the present disclosure. Referring to FIG. 3A and FIG. 3B together, this embodiment is an improvement to the embodiment described above with reference to FIG. 2. Specifically, on the basis of providing the above-mentioned conductive screening portion 7, the shielding member further includes a filling portion 13, an orthographic projection of the filling portion 13 on the substrate covers an orthographic projection of the data line 5 on the substrate that is not covered by an orthographic projection of the conductive screening portion 7, and the filling portion 13 protrudes outward from the surface of the substrate in a direction away from the substrate.

Figure 4:
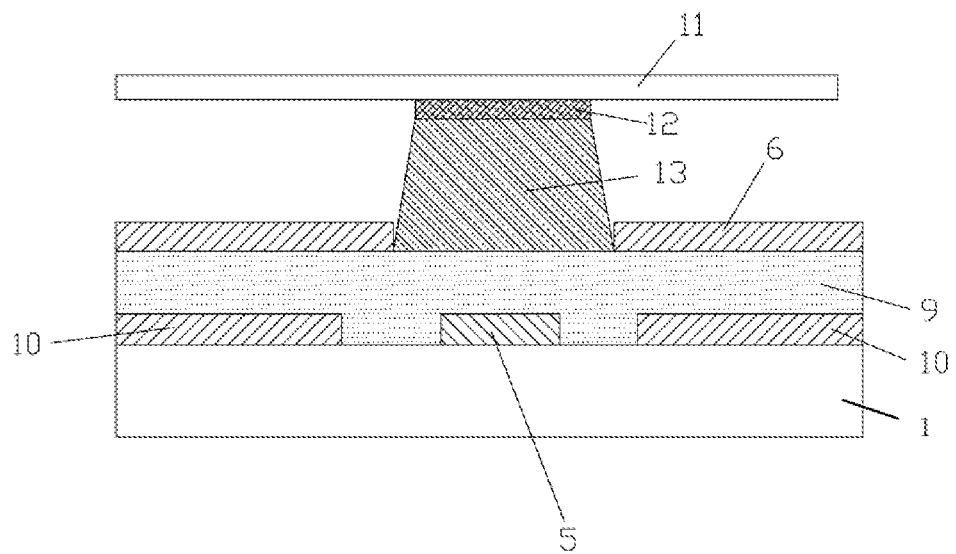
FIG. 4 is a partial cross-sectional view of a display device according to an embodiment of the present disclosure.

FIG. 4 is a partial cross-sectional view of a display device according to an embodiment of the present disclosure. Referring to FIG. 4, the display device includes the array substrate shown in FIG. 3B, a color filter substrate 11 arranged opposite to the array substrate, and liquid crystals filled within a space between the array substrate and the color filter substrate 11. As shown in FIG. 4, the filling portion 13 protrudes outward from the surface of the substrate 1 in a direction away from the substrate 1, and the filling portion 13 is arranged between a black matrix 12 on the color filter substrate 11 and an insulating layer 9 on the array substrate, and the filling portion 13 can be used as a spacer. Since the filling portion 13 protrudes outward from the surface of the substrate 1 in a direction away from the substrate 1, the filling portion 13 can fill a space originally filled by liquid crystals.

For the case where the conductive screening portion 7 has a structure in which a plurality of conductive strips are spaced apart in the extending direction of the data line 5, the above-described filling portion 13 is provided in a space area between two adjacent conductive strips. For the case where the conductive screening portion 7 has a structure in which a plurality of first conductive strips 71 cross each other to form a grid-like structure, the filling portion 13 is provided in a hollow area of the grid-like structure.

By means of the filling portion 13, an orthographic projection of the data line 5 on the substrate 1 that is not covered by an orthographic projection of the conductive screening portion 7 on the substrate 1 can be prevented from being covered by liquid crystals, so that light leakage due to an abnormal deflection of liquid crystals on this area can be solved.

The material used for the filling portion 13 may include an insulating material such as silicon nitride or an organic material to avoid occurrence of Data Com Short. According to an embodiment of the present disclosure, the material of the filling portion 13 may be the same as the material of the insulating layer.

Other structures of the array substrate provided in this embodiment are the same as those in the above embodiment, and are not described herein again.

Figure 5A:
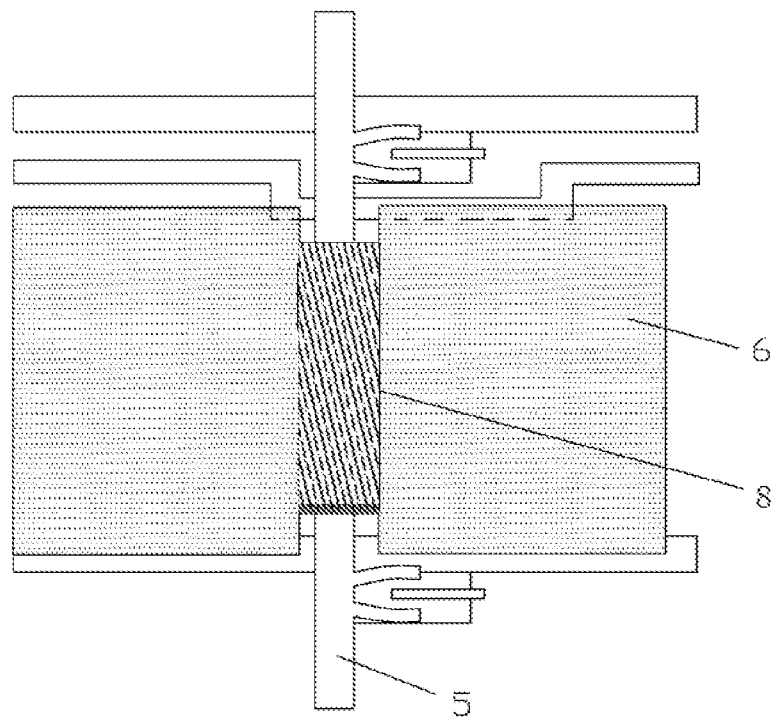
FIG. 5A is a partial plan view of an array substrate according to yet another embodiment of the present disclosure.
Figure 5B:
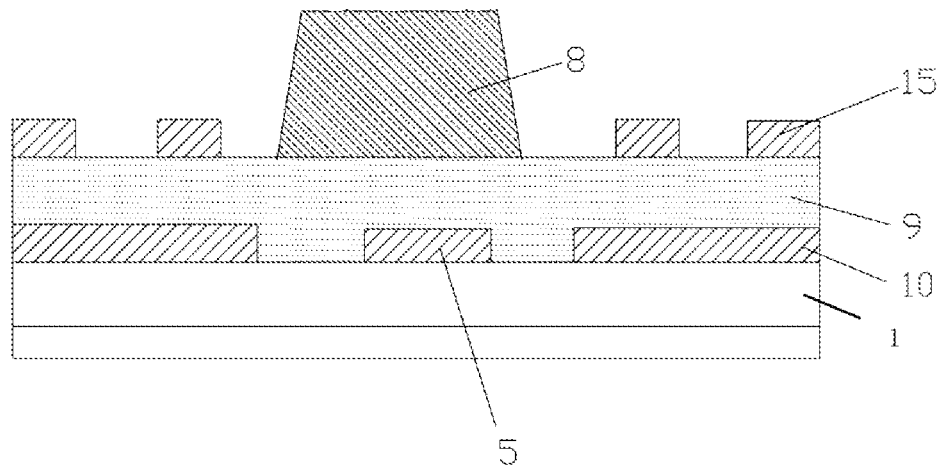
FIG. 5B is a partial cross-sectional view of the array substrate of FIG. 5A according to yet another embodiment of the present disclosure.

FIG. 5A is a partial plan view of an array substrate according to yet another embodiment of the present disclosure, and FIG. 5B is a partial cross-sectional view of the array substrate of FIG. 5A according to yet another embodiment of the present disclosure. Referring to FIGS. 5A and 5B, an array substrate provided by an embodiment of the present disclosure is different from the above embodiment in that the shielding member includes a filling body 8. Specifically, an orthographic projection of the filling body 8 on the substrate 1 may cover an orthographic projection of the data line 5 on the substrate 1, and protrude outward from the surface of the substrate 1 in a direction away from the substrate. In an exemplary embodiment, an orthographic projection of the filling body 8 on the substrate 1 may completely cover an orthographic projection of the data line 5 on the substrate 1.

Figure 6:
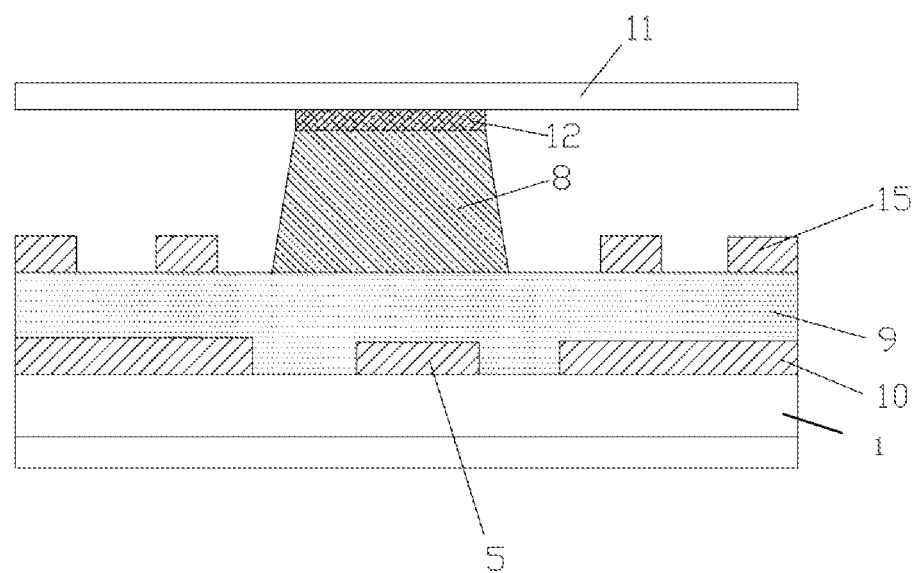
FIG. 6 is a partial cross-sectional view of a display device according to another embodiment of the present disclosure.

FIG. 6 is a partial cross-sectional view of a display device according to another embodiment of the present disclosure. Referring to FIG. 6, the display device includes the array substrate shown in FIGS. 5A and 5B, the color filter substrate 11 arranged opposite to the array substrate, and liquid crystals filled within a space between the array substrate and the color filter substrate 11. The filling body 8 is arranged between the black matrix 12 on the color filter substrate 11 and the insulating layer 9 on the array substrate, and the filling body 8 can be used as a spacer. Since the filling body 8 protrudes outward from the surface of the substrate 1 in a direction away from the substrate 1, the filling body 8 can fill the space originally filled by liquid crystals, so that this area is not covered by liquid crystals, thereby solving light leakage caused by an abnormal deflection of liquid crystals on this area from the source. In addition, the material used for the filling body 8 may include an insulating material such as silicon nitride or an organic material to avoid occurrence of Data Com Short. According to an embodiment of the present disclosure, the material of the filling body 8 may be the same as the material of the insulating layer.

In practical applications, the section of the above-mentioned filling body 8 may be a shape such as a rectangular or an isosceles trapezoid which can well support.

In the present embodiment, the common electrode 15 is comb-shaped, but the embodiment of the present disclosure is not limited thereto. In practical applications, the common electrode 15 may also adopt any other structure such as a plate shape or the like.

Each of the pixel units further includes a pixel electrode 10 which is arranged in a different layer from the common electrode 6 or common electrode 15, and there is an insulating layer 9 arranged between the pixel electrode 10 and the common electrode 6 or common electrode 15.

In summary, by arranging an orthographic projection of the conductive screening portion 7 on the substrate 1 that partially covers an orthographic projection of the data line 5 on the substrate 1, the risk area can be reduced, thereby reducing the occurrence of Data Com Short, or, by means of the filling body 8, an orthographic projection of the filling body 8 on the substrate 1 completely covers an orthographic projection of the data line 5 on the substrate 1, and fills the space occupied by liquid crystals and corresponding to the area which covers the data line 5, the occurrence of Data Com Short can be avoided, thereby improving product yield.

As another technical solution, an embodiment of the present disclosure further provides a display panel including the array substrate provided by the above embodiments of the present disclosure.

The display panel provided by the embodiment of the present disclosure can avoid the occurrence of Data Com Short by using the array substrate provided by the above embodiments of the present disclosure, thereby improving product yield.

As another technical solution, an embodiment of the present disclosure further provides a display device including the display panel provided by the above embodiment of the present disclosure.

The display device provided by the embodiment of the present disclosure can avoid the occurrence of Data Com Short by using the display panel provided by the above embodiment of the present disclosure, thereby improving product yield.

It is to be understood that the above embodiments are merely exemplary embodiments employed to explain the principles of the embodiments of the present disclosure, but the embodiments of the present disclosure are not limited thereto. Various modifications and improvements can be made by those of ordinary skill in the art without departing from the spirit and scope of the embodiments of the present disclosure. These modifications and improvements are also considered to fall within the scope of protection of the embodiments of the present disclosure.

What is claimed is:

1. An array substrate comprising:
 a substrate;
 a data line located above the substrate; and
 a shielding member located on a side, away from the substrate, of the data line,
 wherein i) the shielding member comprises a conductive screening portion, an orthographic projection of the conductive screening portion on the substrate partially covering an orthographic projection of the data line on the substrate, and
 ii) the shielding member comprises a filling body, an orthographic projection of the filling body on the substrate covering an orthographic projection of the data line on the substrate,
 wherein the conductive screening portion comprises a plurality of first conductive strips spaced apart along an extending direction of the data line, wherein the plurality of first conductive strips cross each other to form a grid-like structure, and wherein each of the first conductive strips extends beyond the data line along a direction perpendicular to the extending direction of the data line, and wherein an orthographic projection of each of the first conductive strips on the substrate partially covers the orthographic projection of the data line on the substrate,
 wherein the array substrate further comprises a plurality of pixel units each comprising a common electrode, wherein the common electrode is arranged in the same layer as the filling body, and wherein an entire top surface of the filling body, between two adjacent common electrodes, protrudes outward from a surface of the substrate in a direction away from the substrate, and wherein the filling body is provided in a hollow area of the grid-like structure.

2. The array substrate according to claim 1, wherein the shielding member comprises the conductive screening portion, and wherein the shielding member further comprises a filling portion, an orthographic projection of the filling portion on the substrate covering an orthographic projection of the data line on the substrate not covered by an orthographic projection of the conductive screening portion, and the filling portion protruding outward from a surface of the substrate in a direction away from the substrate.

3. The array substrate according to claim 1, wherein the shielding member comprises the conductive screening portion, wherein the common electrode is arranged in the same layer as the conductive screening portion, and wherein the common electrodes of two adjacent pixel units are integrally formed with the conductive screening portion between the common electrodes of the two adjacent pixel units.

4. The array substrate according to claim 3, wherein each of the pixel units further comprises a pixel electrode, and wherein the pixel electrode and the common electrode are arranged in different layers with an insulating layer arranged therebetween.

5. The array substrate according to claim 1, wherein the shielding member comprises the filling body, and wherein the array substrate further comprises a plurality of pixel units each comprising a common electrode and a pixel electrode arranged in different layers with an insulating layer arranged therebetween.

6. The array substrate according to claim 1, wherein a material used for the filling body comprises one of silicon nitride and an organic material.

7. The array substrate according to claim 1, wherein a section of the filling body is one of rectangular and isosceles trapezoidal.

8. A display panel comprising the array substrate according to claim 1.

9. A display device comprising the display panel according to claim 8.

10. The array substrate according to claim 1, wherein the shielding member comprises the conductive screening portion, and wherein the shielding member further comprises a filling portion, an orthographic projection of the filling portion on the substrate covering an orthographic projection of the data line on the substrate not covered by an orthographic projection of the conductive screening portion, and the filling portion protruding outward from a surface of the substrate in a direction away from the substrate.

11. The array substrate according to claim 1, wherein the shielding member comprises the conductive screening portion, and wherein the array substrate further comprises a plurality of pixel units each comprising a common electrode, wherein the common electrode is arranged in the same layer as the conductive screening portion, and wherein the common electrodes of two adjacent pixel units are integrally formed with the conductive screening portion between the common electrodes of the two adjacent pixel units.

* * * * *